(12) United States Patent
Bastin

(10) Patent No.: US 6,408,275 B1
(45) Date of Patent: Jun. 18, 2002

(54) METHOD OF COMPRESSING AND DECOMPRESSING AUDIO DATA USING MASKING AND SHIFTING OF AUDIO SAMPLE BITS

(75) Inventor: Roger Bastin, Carp (CA)

(73) Assignee: Zarlink Semiconductor, Inc., Ottawa (CA)

( * ) Notice: Subject to any disclaimer, the term of this patent is extended or adjusted under 35 U.S.C. 154(b) by 0 days.

(21) Appl. No.: 09/336,362

(22) Filed: Jun. 18, 1999

(51) Int. Cl.[7] ............................................. G10L 21/04
(52) U.S. Cl. ...................................... 704/500; 704/211
(58) Field of Search ................................ 704/500, 211, 704/212

(56) References Cited

U.S. PATENT DOCUMENTS 5,553,220 A   9/1996   Keene .......................... 345/520
5,881,259 A   3/1999   Glass et al. .................. 712/210

*Primary Examiner*—Tālivaldis Irars Šmits
(74) *Attorney, Agent, or Firm*—Jones, Day, Reavis and Pogue

(57) ABSTRACT

A method of compressing audio data comprising the steps of receiving a stream of digital audio samples; masking a predetermined number of lower order bits from each one of the samples; and shifting an identical number of higher order bits from an adjacent one of the digital audio samples into the respective samples so as to occupy bit locations of the lower order bits which have been masked.

2 Claims, 2 Drawing Sheets

METHOD OF COMPRESSING AND DECOMPRESSING AUDIO DATA USING MASKING AND SHIFTING OF AUDIO SAMPLE BITS

FIELD OF THE INVENTION

The present invention relates in general to voice communications systems, and more particularly to a voice compression method with low processing overhead.

BACKGROUND OF THE INVENTION

In general, compressed data allows information to be stored more efficiently than uncompressed data or transferred at a greater rate or with a greater volume. Typically compression is performed prior to storage or transmission and decompression is performed after retrieval or reception. The compression and decompression operations require significant processing time, which is particularly critical in real-time applications such as live audio.

The compression of voice data is typically done using any one of a number of well known ADPCM (ADaptive Pulse Code Modulation) algorithms. These algorithms require substantial processing, and are implemented using a DSP or equivalent processor. Many cost sensitive implementations do not have this processing capability and can not afford the expense and complexity of incorporating a DSP into the design.

SUMMARY OF THE INVENTION

According to the present invention, a voice audio compression method is provided whereby lower order audio bits are stripped off from the audio data stream. By loosing the lower order information bandwidth is gained, hence compression is achieved. Since the operation of stripping off the lower order bits is computationally trivial, the use of DSPs or other expensive processors is eliminated thereby allowing widespread use of this compression method in low cost applications.

The compression algorithm of the present invention essentially reduces the resolution of the voice samples. This naturally has a negative effect on voice quality, with fewer discrete steps to represent the original audio stream. The small signal characteristics of the signal suffer so that minor variances about a specific level will be filtered out. Thus, quiet audio (e.g. a whisper) is effectively eliminated from the audio stream. The inventor has discovered that the voice transmission quality is not unduly degraded as a result of the loss of the least significant bits of information from every voice sample.

Most voice grade audio data is encoded according to a companding law. Companding is utilized to maximize the dynamic range (ratio of largest resolvable signal to the smallest) capacity of a given audio channel. A non-linear (usually logarithmic) transform is applied to the sampled audio signal yielding the companded audio stream. The net effect is to enhance the small signal characteristics of the audio stream allowing smaller signal variations to be resolved, hence increasing the channel dynamic range. Consequently, there is less resolution for large signal variations, thereby degrading the signal to noise ratio compared to an uncompanded stream.

Thus, applying the compression algorithm of the present invention to a companded data stream minimizes the ill effects of the compression since companding counteracts the small signal degradation due to compression. There is, however, a further degradation in the signal to noise ratio since there are fewer levels to represent the companded signal. Thus, the principle tradeoff in a companded application of the inventive compression algorithm is the addition of noise or fuzziness to the original signal, which can be adjusted, based on the number of bits dropped from the companded signal.

The compression method of the present invention may be applied to any audio application that requires simple compression of the audio data and can afford some degradation in audio quality. It can be applied to linear PCM or companded PCM streams, although linear streams are more prone to small signal degradation, which can limit the achievable level of compression.

BRIEF DESCRIPTION OF THE DRAWINGS

A preferred embodiment of the invention is described herein below with reference to the accompanying drawings, in which.

DETAILED DESCRIPTION OF THE PREFERRED EMBODIMENT

According to the preferred embodiment of the invention for the instance of two times compression, the basic process for compressing the data stream is to remove the lower nibble (bits 0–3) of every sample (assuming 8 bit $\mu$Law PCM samples). Every transmitted or stored byte thus contains two samples of data (i.e. one sample is stored in the upper nibble and the second sample is shifted into the lower nibble).

In order to decompress the data, one sample (nibble of compressed data) is positioned into the upper nibble of a zeroed byte. This reconstructs the original upper nibble of the sample, which contains the most significant information. Additionally bit 3 of the lower nibble is set high which positions the lower nibble halfway between two possible discrete values. This limits the reconstruction to a maximum error of within 8 discrete values instead of a possible error of 16 for just a zeroed lower nibble. The following Table illustrates a comparison between the error in the compressed signal (as a result of the zeroed nibble) and the decompressed signal for each possible bit value in the lower nibble of the original audio signal byte:

TABLE

| Original | Zeroed Nibble (Err) | Nibble=1000 (Err) |
|---|---|---|
| XXXX0000 | XXXX0000 (0) | XXXX1000 (8) |
| XXXX0001 | XXXX0000 (1) | XXXX1000 (7) |
| XXXX0010 | XXXX0000 (2) | XXXX1000 (6) |
| XXXX0011 | XXXX0000 (3) | XXXX1000 (5) |
| XXXX0100 | XXXX0000 (4) | XXXX1000 (4) |
| XXXX0101 | XXXX0000 (5) | XXXX1000 (3) |
| XXXX0110 | XXXX0000 (6) | XXXX1000 (2) |
| XXXX0111 | XXXX0000 (7) | XXXX1000 (1) |
| XXXX1000 | XXXX0000 (8) | XXXX1000 (0) |

TABLE-continued

| Original | Zeroed Nibble (Err) | Nibble=1000 (Err) |
|---|---|---|
| XXXX1001 | XXXX0000 (9) | XXXX1000 (1) |
| XXXX1010 | XXXX0000 (10) | XXXX1000 (2) |
| XXXX1011 | XXXX0000 (11) | XXXX1000 (3) |
| XXXX1100 | XXXX0000 (12) | XXXX1000 (4) |
| XXXX1101 | XXXX0000 (13) | XXXX1000 (5) |
| XXXX1110 | XXXX0000 (14) | XXXX1000 (6) |
| XXXX1111 | XXXX0000 (15) | XXXX1000 (7) |

In the foregoing Table, "X" denotes "don't care", while the number in parentheses represents the error between the indicated byte and the original signal byte. It will be noted that the maximum error reduces from 15 to 8 as a result of setting the least significant nibble to 1000 b in the reconstruction. Additionally, the nominal error is reduced from 7.5((15+14+13+ . . . +1+0)/16) to 4((8+2×7+2×6+2×5+ . . . +2×1+0)/16).

Figure 1:
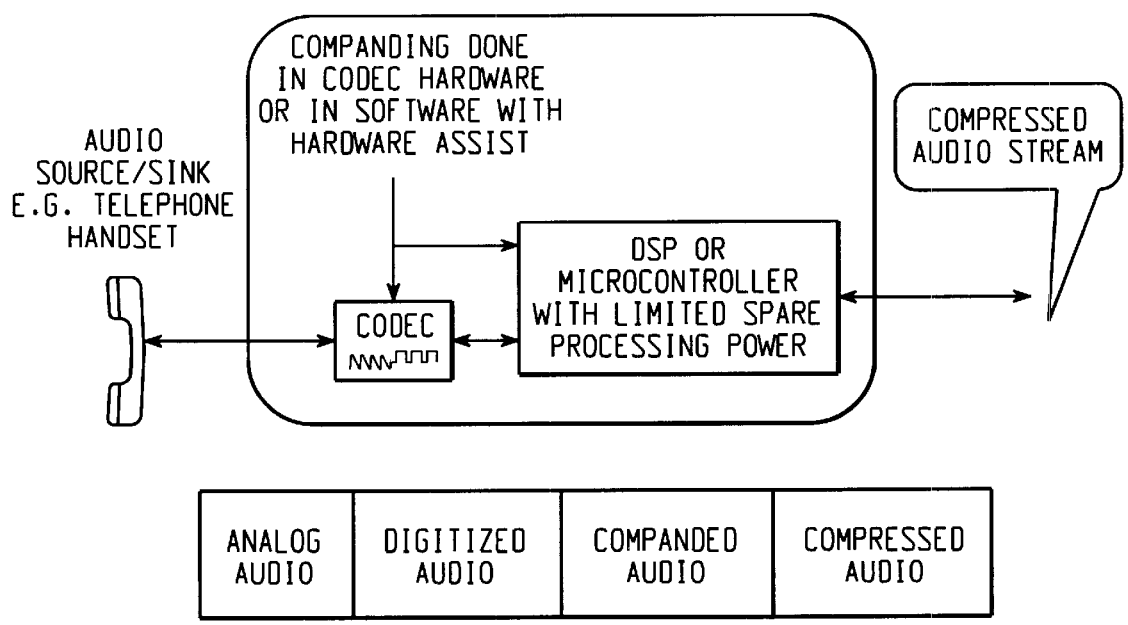
FIG. 1 is a block diagram of a typical implementation of a system for implementing the compression algorithm according to the present invention.

FIG. 1 illustrates a typical implementation of the compression method according to the present invention: namely the decompression/compression of audio to/from a telephone handset. Both directions of transport are applicable but only the transfer of audio from the handset will be described.

Analog audio is sampled (usually at 8 kHz) by a standard codec which converts the analog data to PCM sampled data. The PCM data is then typically companded to maintain the dynamic range of the signal within single byte samples. This process is commonly performed in hardware (either a codec or DSP hardware) but can be executed as a software algorithm. Regardless, the processor receives a companded PCM stream that requires some compression to be performed due to limitations within the destination media (e.g. a bandwidth limitation on the transport stream or some storage constraint in a recording device). The compression algorithm of the present invention is then applied (as an alternative to prior art compression techniques (e.g. ADPCM)).

Figure 2:
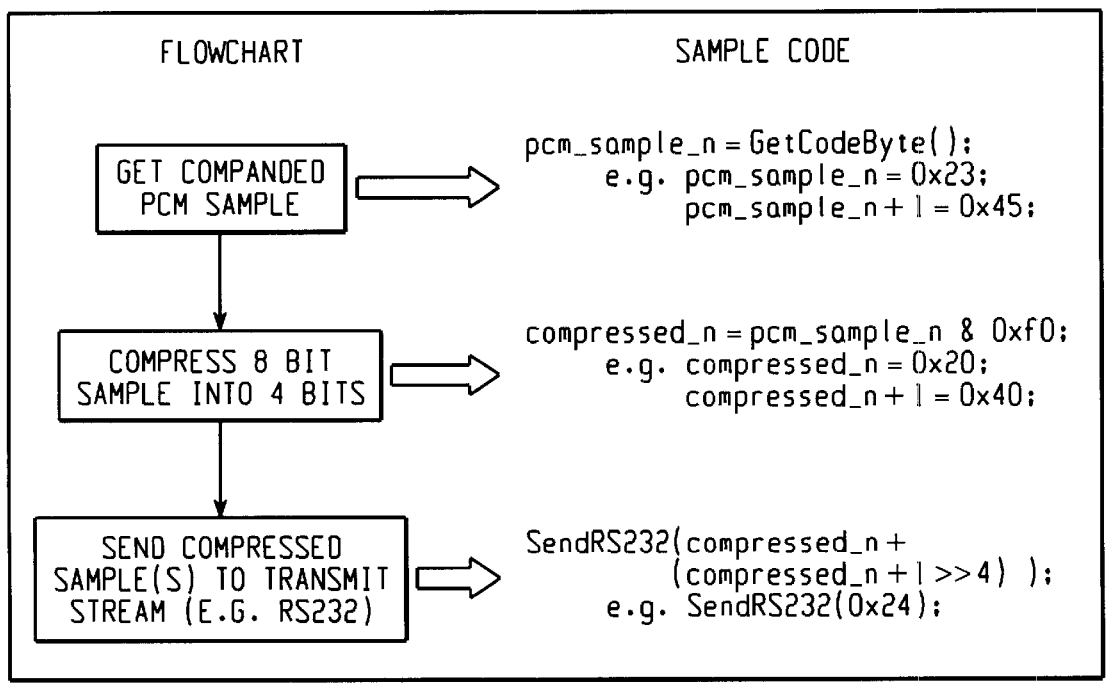
FIG. 2 is a flowchart and accompanying pseudocode showing an implementation of the inventive compression algorithm according to a preferred embodiment.

The implementation of the compression algorithm or method of the preferred embodiment is illustrated in FIG. 2. The algorithm simply masks the desired number of least significant bits, effectively eliminating them from the transmit stream. The tradeoff, as discussed earlier, is a reduction in audio quality proportional to the number of bits removed from each sample. In the example shown in FIG. 2, 8 bit data is compressed to 4 bit data, which results in a good compromise between the degree of compression and quality of the resulting audio.

Figure 3:
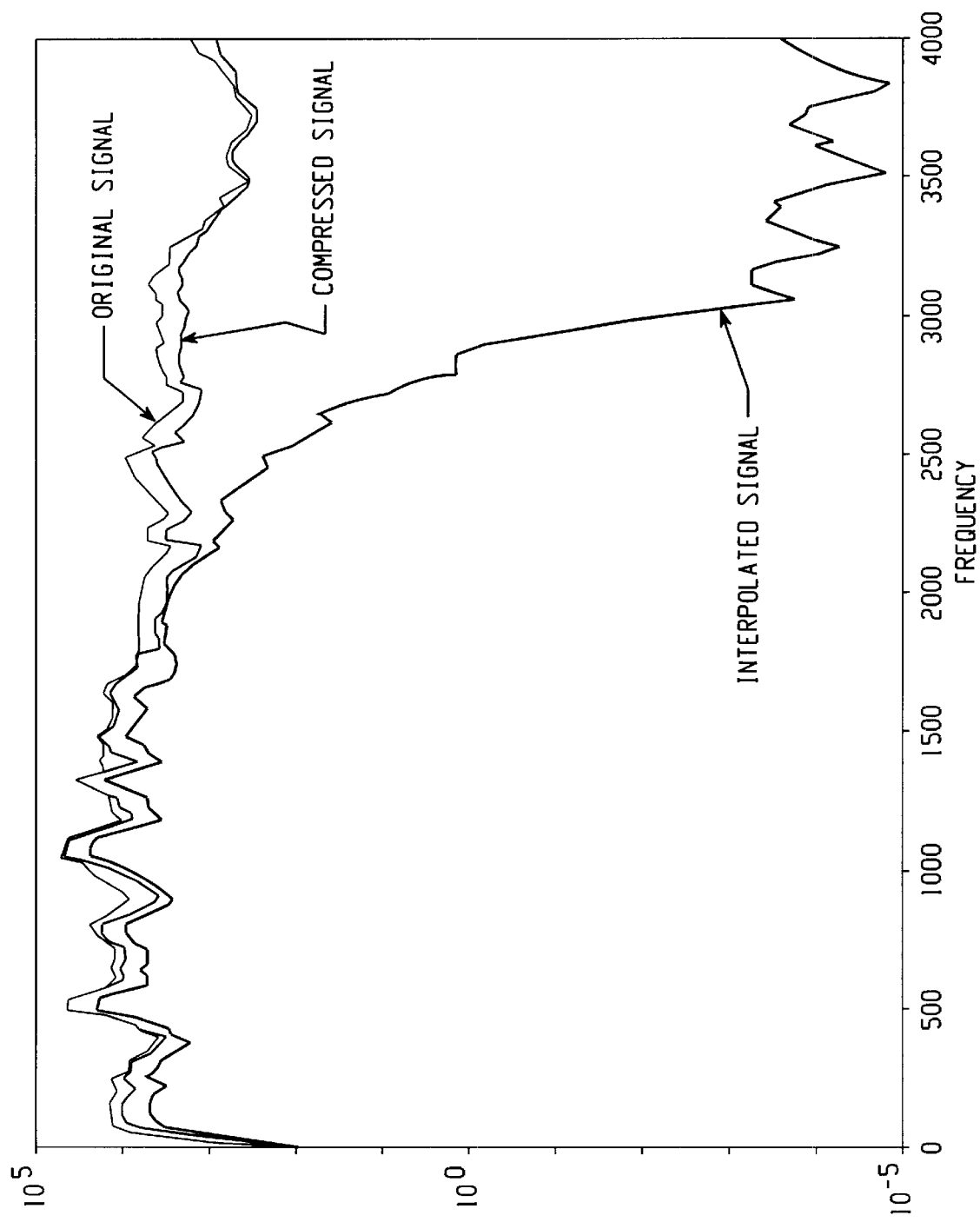
FIG. 3 is a plot of the transfer characteristics of a decompressed 4 bit audio data stream relative to an uncompressed 8 bit audio data stream.

As shown in FIG. 3, the power spectral density of the compressed signal closely follows that of the original signal. The plot compares the power spectral density after the compressed data has been decompressed using the process described previously. The original signal is an 8 bit µLaw voice recording and the comparison illustrates how the invention maintains the essence of the original signal while achieving 50% compression. The processing burden of this algorithm is trivial compared to other compression/decompression techniques.

Additionally, for comparison, the result of simply interpolating between every other sample in the reconstruction is also shown in FIG. 3. This approach achieves the same 50% compression ratio by removing every other sample during compression and then interpolating the data on decompression. It also is computationally trivial, yet fails to achieve even comparable results for faithfully reproducing the original signal as evidenced by the sharp deviation for frequencies above 2000 Hz. Intuitively this makes sense since loosing every other sample effectively decreases the sampling rate from 8 kHz to 4 kHz.

As indicated above, the compression method of the present invention can be used wherever audio compression is required. Specifically it can be applied where audio needs to be digitally stored or transmitted on or across any limited media. It is particularly useful in low-cost implementations to provide adequate audio compression without incurring a substantial processing burden on the design.

The following possible applications are noted:

Audio recording/playback in answering machines.

Children's toys to record/playback sounds.

Peripheral devices which terminate or originate voice data across a bandwidth limited media (e.g. wireless phone, or computer attached phone with voice sent over the computer-phone link).

Alternatives and variations of the invention are possible, all of which are believed to be within the sphere and scope of the claims appended hereto.

What is claimed is:

1. A method of compressing and decompressing audio data, comprising the steps of:

(a) receiving a stream of digital audio samples;

(b) masking a predetermined number of lower order bits from each one of said samples;

(c) shifting an identical number of higher order bits from an adjacent one of said digital audio samples into said one of said samples so as to occupy bit locations of said lower order bits which have been masked in order to form compressed samples; and (d) decompressing the compressed samples by: (1) shifting the higher order bits and lower order bits of each compressed sample into the higher order bit locations of respective zeroed samples; and (2) setting high a bit adjacent said higher order bit locations of said respective zeroed samples.

2. The method of claim 1, wherein each of said digital audio samples is an eight bit PCM sample and both said predetermined number of lower order bits and said identical number of higher order bits is four.

* * * * *